*US008750719B2*

(12) United States Patent
Yamada et al.

(10) Patent No.: US 8,750,719 B2
(45) Date of Patent: Jun. 10, 2014

(54) VISIBLE LIGHT COMMUNICATION RECEIVER, VISIBLE LIGHT COMMUNICATION SYSTEM, AND VISIBLE LIGHT COMMUNICATION METHOD

(75) Inventors: Masashi Yamada, Takasaki (JP); Kousuke Nakamura, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 153 days.

(21) Appl. No.: 13/479,992

(22) Filed: May 24, 2012

(65) Prior Publication Data
US 2012/0230703 A1 Sep. 13, 2012

Related U.S. Application Data

(63) Continuation of application No. PCT/JP2011/056157, filed on Mar. 16, 2011.

(30) Foreign Application Priority Data

May 14, 2010 (JP) ................................. 2010-112586

(51) Int. Cl.
*H04B 10/00* (2013.01)
(52) U.S. Cl.
USPC ......................................................... 398/172
(58) Field of Classification Search
CPC ..................................................... H04B 10/116
USPC .......................................................... 398/172
See application file for complete search history.

(56) References Cited

U.S. PATENT DOCUMENTS

| 7,689,132 B2 | 3/2010 | Chen et al. |
| 2006/0245765 A1* | 11/2006 | Elahmadi et al. ............. 398/189 |
| 2007/0031157 A1 | 2/2007 | Yamada et al. |
| 2007/0171946 A1 | 7/2007 | Hase et al. |

(Continued)

FOREIGN PATENT DOCUMENTS

| JP | 6231406 | 8/1994 |
| JP | 2003318836 | 11/2003 |

(Continued)

OTHER PUBLICATIONS

International Search Report in counterpart International Application No. PCT/JP2011/056157, mailed Jun. 7, 2011.

(Continued)

*Primary Examiner* — Leslie Pascal
(74) *Attorney, Agent, or Firm* — Edell, Shapiro & Finnan, LLC

(57) ABSTRACT

A visible light communication receiver increases a communication distance from a transmitter to a receiver while realizing high transmission speed. The visible light communication receiver includes a receiving unit that receives a visible light signal from a blue light-excited white LED driven by a driving current signal generated by adding rising and falling pulses to respective rising and falling edges of a transmission data encoded according to a DC-free RLL code having a minimum run of 1 and NRZI-modulated prior to adding the rising and falling pulses; a photoelectric converter that converts the visible light signal into an electrical signal; an equalizer that equalizes the electrical signal to a duobinary signal; a discriminator that discriminates the duobinary signal to generate a 3-value signal; a maximum-likelihood decoder that ML-decodes the 3-value signal to output a decoded signal; and a decoder that RLL decodes the decoded signal.

8 Claims, 16 Drawing Sheets

(56) References Cited

U.S. PATENT DOCUMENTS

| | | |
|---|---|---|
| 2008/0131140 A1 | 6/2008 | Shin et al. |
| 2008/0212981 A1 | 9/2008 | Yamada et al. |
| 2012/0230703 A1 | 9/2012 | Yamada et al. |
| 2012/0257901 A1 | 10/2012 | Yamada et al. |

FOREIGN PATENT DOCUMENTS

| | | |
|---|---|---|
| JP | 2007043592 | 2/2007 |
| JP | 2009188813 | 8/2009 |
| JP | 2010-103979 | 5/2010 |
| WO | 2006030911 A1 | 3/2006 |
| WO | 2010035896 A1 | 4/2010 |

OTHER PUBLICATIONS

Office Action in corresponding Korean Application No. 10-2012-7013134, dated Jul. 17, 2013, along with an English translation.

Office Action in corresponding Japanese Application No. 2010-112586, mailed May 14, 2013, along with an English translation.

* cited by examiner

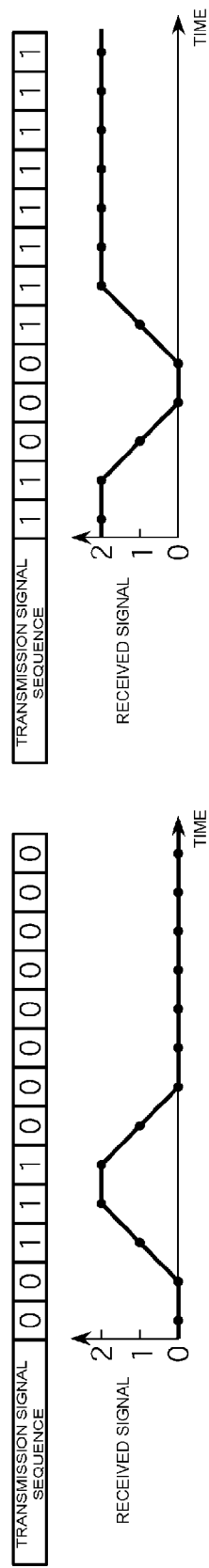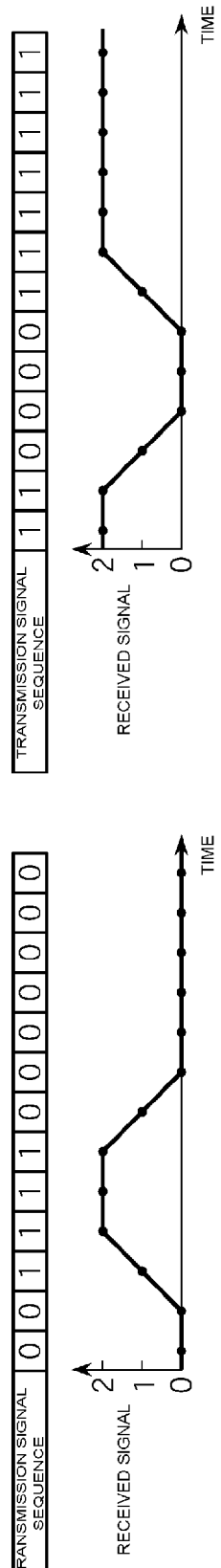

VISIBLE LIGHT COMMUNICATION RECEIVER, VISIBLE LIGHT COMMUNICATION SYSTEM, AND VISIBLE LIGHT COMMUNICATION METHOD

CROSS REFERENCE TO RELATED APPLICATIONS

This application is a continuation of International Application No. PCT/JP2011/056157, filed on Mar. 16, 2011, entitled "Visible Light Communication Receiver, Visible Light Communication System, and Visible Light Communication Method," which claims priority under 35 U.S.C. §119 to Japanese Application No. 2010-112586 filed on May 14, 2010, entitled "Visible Light Communication Receiver, Visible Light Communication System, and Visible Light Communication Method," the entire contents of which are hereby incorporated by reference.

FIELD OF THE INVENTION

The present invention relates to a visible light communication receiver, a visible light communication system and a visible light communication method, and more particularly, to a visible light communication receiver, a visible light communication system and a visible light communication method wherein data is transmitted by white light emitted from a blue light-excited white light emitting diode (LED).

BACKGROUND

A visible light communication system transmitting data using a white light emitted from a white light emitting diode (LED) as a transmission medium is known. For example, Japanese Patent No. 3465017 (Patent Document 1) discloses a visible light communication system performing a data transmission operation by enabling a white LED to emit a white light in response to a driving signal modulated based on transmission data, receiving the white light emitted from the white LED through a receiver, and converting a light signal embedded in the received white light into an electrical signal using a photoelectric converter such as a photodiode (PD).

An LED (hereinafter referred to as "blue light-excited white LED") in which an yttrium aluminum garnet (YAG)-based fluorescent material is disposed around a blue LED is known as a white LED that may be used as a generic light source. In the blue light-excited white LED, the fluorescent material disposed around the blue LED is excited by blue light emitted from the blue LED, and yellow light outputted from the fluorescent material is mixed with blue light emitted from the blue LED so that pseudo-white light can be obtained.

A data transmission operation using an output light from the blue light-excited white LED as a transmission medium provides a relatively low transmission speed of about several Mbps (refer to Non-patent Document below). This is because the transmission speed of the entire system is restricted by a low response speed of the fluorescent material. Thus, various methods of improving the transmission speed have been proposed. For example, Patent Document 1 proposes a method of realizing a transmission speed of about tens of Mbps by providing a color filter configured to transmit only blue light at a receiver side and removing a yellow light component emitted from the fluorescent material of the white light emitted from a blue light-excited white LED using the color filter. Furthermore, Japanese Patent Laid-open Publication No. 2007-43592 (Patent Document 2) proposes a method of improving a transmission speed by adjusting a driving waveform using a peaking circuit based on a result obtained by monitoring a light signal component generated by a blue LED.

PRIOR ART DOCUMENTS

Patent Documents

1. Japanese Patent No. 3465017
2. Japanese Patent Laid-open Publication No. 2007-43592

Non-patent Document

1. "Prototyping LED Driver for Visible Light Communication and Evaluating Response Performance of Visible Light LED," IEICE Technical Report ICD 2005-44, Vol. 105, No. 184, 25 to 30 p.

SUMMARY

The transmission quality of a visible light communication is easily degraded because ambient light acts as a noise. Thus, it is difficult to obtain a sufficient communication distance between a transmitter and a receiver while realizing a high transmission speed. Various embodiments of the present invention provide a visible light communication receiver, a visible light communication system and a visible light communication method, which provides a high transmission speed, increase a communication distance between a transmitter and a receiver, and be constituted by a simple processing circuit.

Other objects of the present invention will be apparent from the following detailed description of embodiments of the invention with reference to the accompanying drawings.

According to one aspect, there is provided a visible light communication receiver including: a receiving unit configured to receive a visible light signal from a blue light-excited white LED driven by a driving current signal generated by adding a rising pulse and a falling pulse to a rising edge and a falling edge of a transmission data, respectively, the transmission data being encoded according to a DC-free RLL code having a minimum run of 1 and NRZI-modulated prior to adding the rising pulse and the falling pulse; a photoelectric converter configured to convert the visible light signal received by the receiving unit into an electrical signal; an equalizer configured to equalize the electrical signal generated by the photoelectric converter to a duobinary signal; a discriminator configured to discriminate the duobinary signal outputted by the equalizer to generate a 3-value signal; a maximum-likelihood decoder configured to ML-decode the 3-value signal generated by the discriminator to output a decoded signal; and a decoder configured to RLL decode the decoded signal outputted by the maximum-likelihood decoder.

According to various embodiments of the present invention, a visible light communication receiver, a visible light communication system and a visible light communication method with improved communication distance between the transmitter and the receiver and a high transmission speed constituted by a simple processing circuit are provided.

BRIEF DESCRIPTION OF THE DRAWINGS

FIGS. 6A through 6D are diagrams showing relationships between a transmission signal sequence and an output sequence of an equalizer according to an embodiment of the present invention.

DETAILED DESCRIPTION

Figure 1:
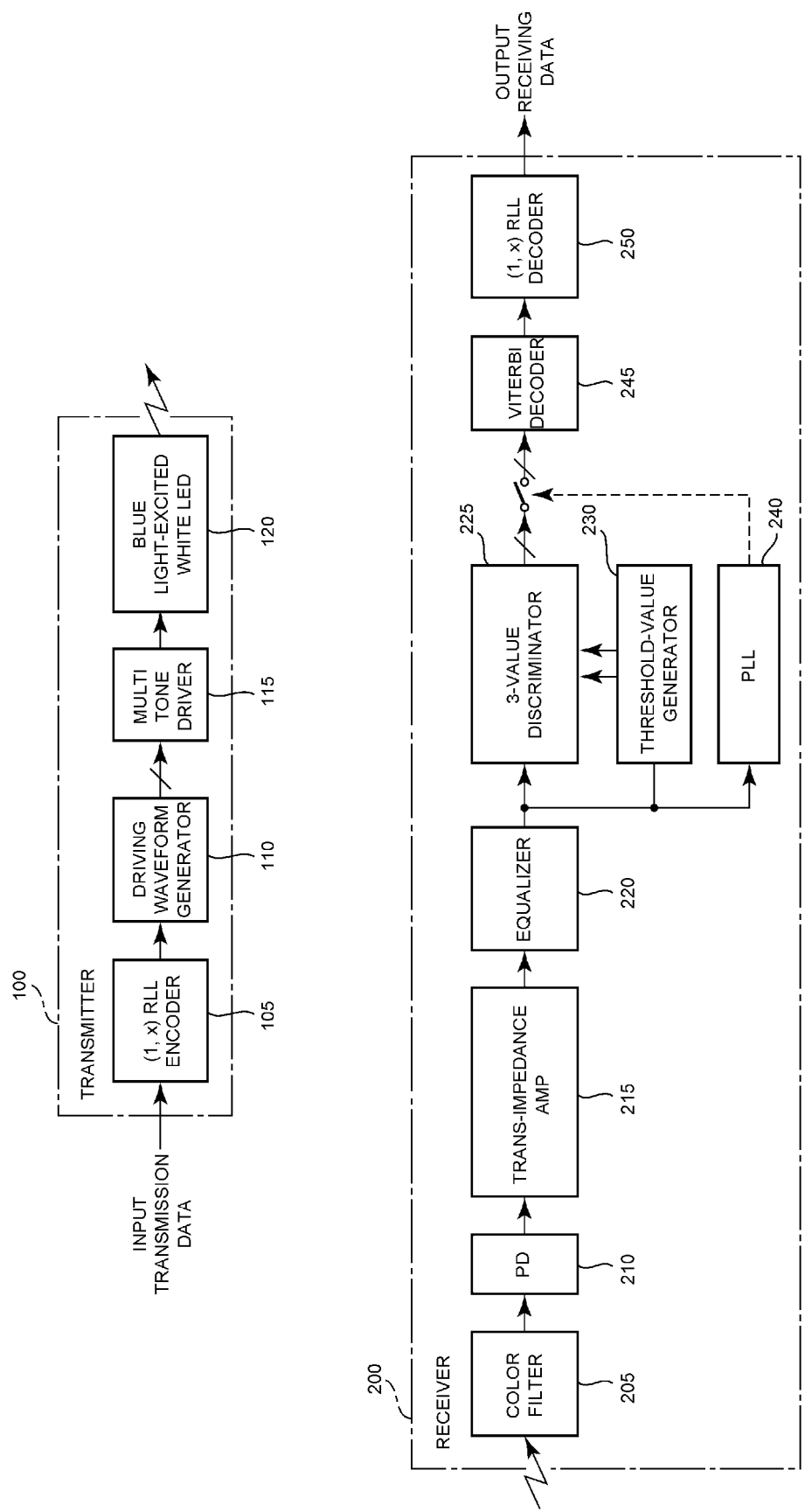
FIG. 1 is a block diagram of a visible light communication system according to an embodiment of the present invention.

Hereinafter, embodiments of the present invention will be described with reference to the accompanying drawings. FIG. 1 is a block diagram showing a visible light communication system according to an embodiment of the present invention. In a visible light communication system according to an embodiment of the present invention, data is transmitted from a transmitter 100 to a receiver 200 using white light outputted from a white light emitting diode (LED) as a medium.

The transmitter 100 includes a (1, x) run-length limited (RLL) encoder 105, a driving waveform generator 110, a multi-tone driver 115 and a blue light-excited white LED 120. The (1, x) RLL encoder 105 encodes transmission data using a (1, x) RLL code and generates an RLL data. The driving waveform generator 110 generates a plurality of tone signals based on the RLL data generated by the (1, x) RLL encoder 105. The multi-tone driver 115 synthesizes the plurality of tone signals generated by the driving waveform generator 110 and generates a driving current. The blue light-excited white LED 120 is driven by the driving current generated by the multi-tone driver 115.

White light emitted from the blue light-excited white LED 120 reaches the receiver 200, and is condensed by a lens via a color filter 205 and incident on a photodiode 210. A trans-impedance amplifier 215, an equalizer 220, a 3-value discriminator 225, a threshold value generator 230, a phase-locked loop (PLL) 240, a Viterbi decoder 245 and a (1, x) RLL decoder 250 are disposed at an output side of the photodiode 210. A photodiode may be referred to as "PD." Hereinafter.

An RLL code used by the (1, x) RLL encoder 105 is a code in which one of or both of a minimum number (minimum run) of consecutive zeroes and a maximum number (maximum run) of consecutive zeroes in a code sequence prior to NRZI (non-return-to-zero inverted) modulation is limited. An RLL code where the minimum run is d and the maximum run is k is denoted as "(d, k) RLL code." When the code sequence encoded according to the (d, k) RLL code is NRZI-modulated, the minimum number of consecutive zeroes (or ones) and the maximum number of consecutive zeroes (or ones) are (d+1) and (k+1), respectively. For example, in an RLL data encoded according to a (1, 7) RLL code, the minimum number of the minimum number of consecutive zeroes (or ones) and the maximum number of consecutive zeroes (or ones) are two and eight, respectively. Hereinafter, a limitation on the number of consecutive bits included in the NRZI-modulated RLL data will sometimes be referred to as "dk side".

In one embodiment, the (1, x) RLL encoder 105 performs an encoding operation using a 17PP code. The 17PP code is a (1, x) RLL code and has a code rate (denoted by m/n, where m denotes a data bit length measured before encoding and n denotes a data bit length measured after encoding) of 2/3. Since the 17PP code is a DC-free code, the 17PP code facilitates a clock signal reproduction at a receiving side and suppression of an unnecessary dispersion that may cause problems when visible light is used as a carrier. Furthermore, since a DC component of a signal modulated according to the 17PP code may be removed by the receiving circuit, the influence of unmodulated ambient light (solar light) may be suppressed. The 17PP code is described in, for example, Japanese Patent No. 3985173, and the significance of the 17PP code is obvious to one skilled in the art. In addition, as compared to a Manchester code or a 8B10B code, as shown in Table 1, since the width of a minimum pulse required for a transmission speed increases, the 17PP code may reduce a required upper limit of a modulation frequency band. Table 1 shows relationships between respective modulation codes and various numerical values. In Table 1, the upper limit of modulation frequency band is calculated by (1/minimum pulse width)× 0.7 which is obtained from experiments.

TABLE 1

| Modulation codes and various numerical values (where a transmission speed is 100 Mbps) | | | | |
|---|---|---|---|---|
| Modulation codes | DC-free | Minimum pulse width (ns) | Upper limit frequency of modulation band (MHz) | Bit rate (Mbps) after encoding |
| NRZ | x | 10 | 70 | 100 |
| Manchester | o | 5 | 140 | 200 |
| 8B10B | o | 8 | 87.5 | 125 |
| 17PP | o | 13.3 | 52.5 | 150 |

Figure 4:
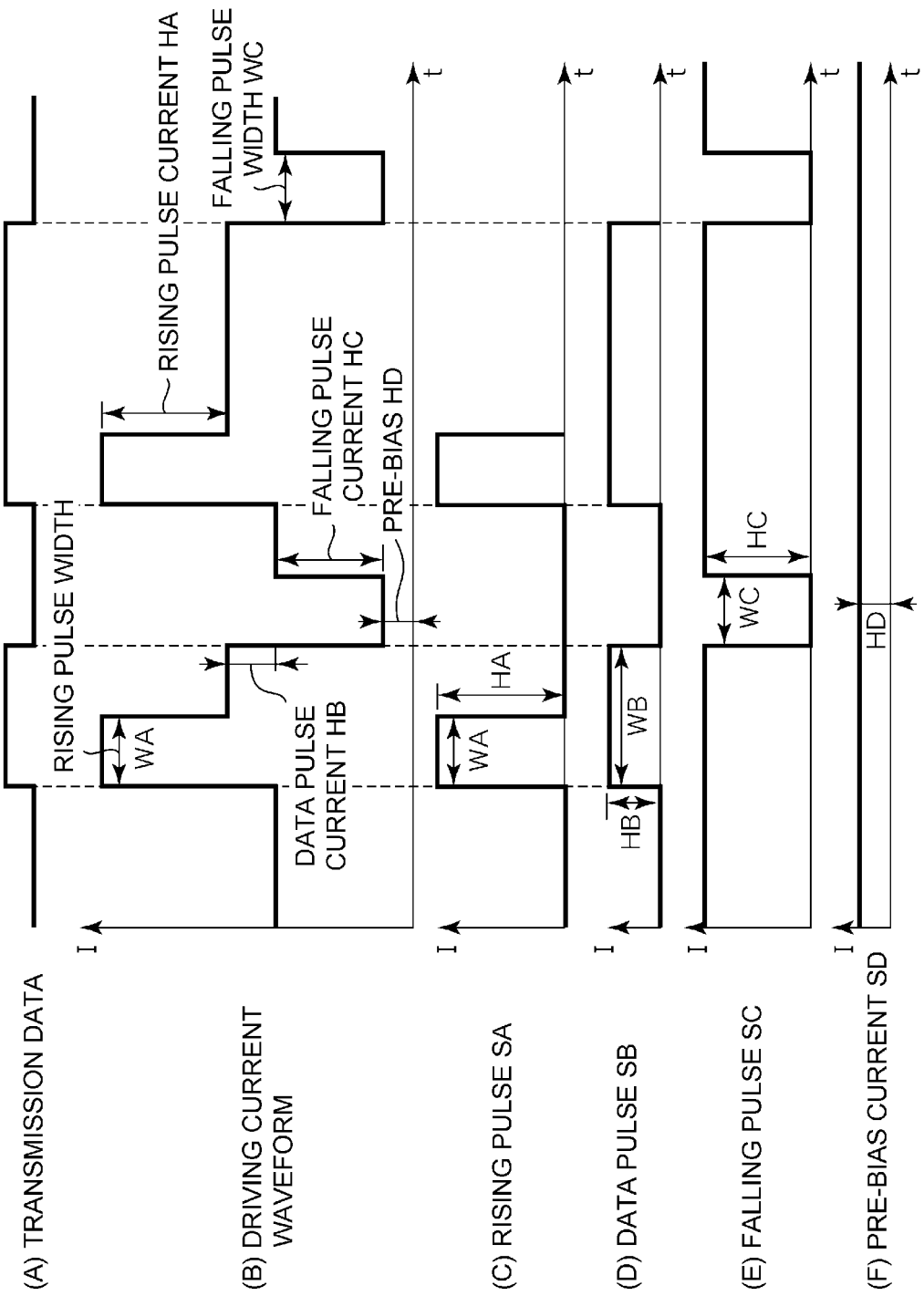
FIG. 4 is a timing chart showing a driving waveform according to an embodiment of the present invention.

The driving waveform generator 110 is constituted by digital circuits including a PLL (not shown) configured to generate a clock and a multiplied clock synchronized with a transmission data pulse, an pulse edge detector (not shown), a one-shot multi-vibrator (not shown) to generate a plurality of tone signals based on the RLL encoded transmission data pulse inputted from the (1, x) RLL encoder 105. FIG. 4 exemplifies a waveform of a tone signal generated by the driving waveform generator 110. The driving waveform generator 110 generates a multi-valued (here, 4-valued) tone signal shown in FIGS. 4C through 4F based on the RLL-encoded transmission data of FIG. 4A. FIG. 4C depicts a tone signal SA that falls after a predetermined time period corresponding to a rising pulse width WA from a rising edge of the transmission data elapses, and FIG. 4E depicts a tone signal SC that rises after a predetermined time period corresponding to a falling pulse width WC from a falling edge of the transmission data elapses. In addition, FIG. 4D depicts a transmission data pulse SB corresponding to the RLL encoded transmission data inputted from the (1, x) RLL encoder 105, and FIG. 4F shows a pre-bias current SD supplied to the digital circuit of the driving waveform generator 110.

The multi-tone driver 115, which is constituted by an OR circuit, synthesizes each of the signals SA, SB, SC and SD outputted by the driving waveform generator 110, generates a driving current, and outputs the generated driving current to the blue light-excited white LED 120 disposed at a rear end thereof. FIG. 4B exemplifies a waveform of the driving current generated by the multi-tone driver 120.

Thus, the driving waveform generator 110 and the multi-tone driver 115 add a rising pulse to the RLL-encoded transmission data during the rising edge of the RLL-encoded transmission data and add a falling pulse to the RLL-encoded transmission data during the falling edge thereof to generate a driving current signal. When the multi-tone driving signal is generated by adding the rising pulse and the falling pulse to the transmission data, an overcurrent exceeding a rated current of an LED that may occur when a peak circuit is employed can be prevented, and optimum driving conditions may be easily obtained even at a high transmission speed. The multi-tone driver 115 is capable of current-driving the LED in nano-second order and also capable of outputting a bias voltage higher than a forward bias voltage of about 3.6 V, which is required for driving the blue light-excited white LED.

Figure 5:
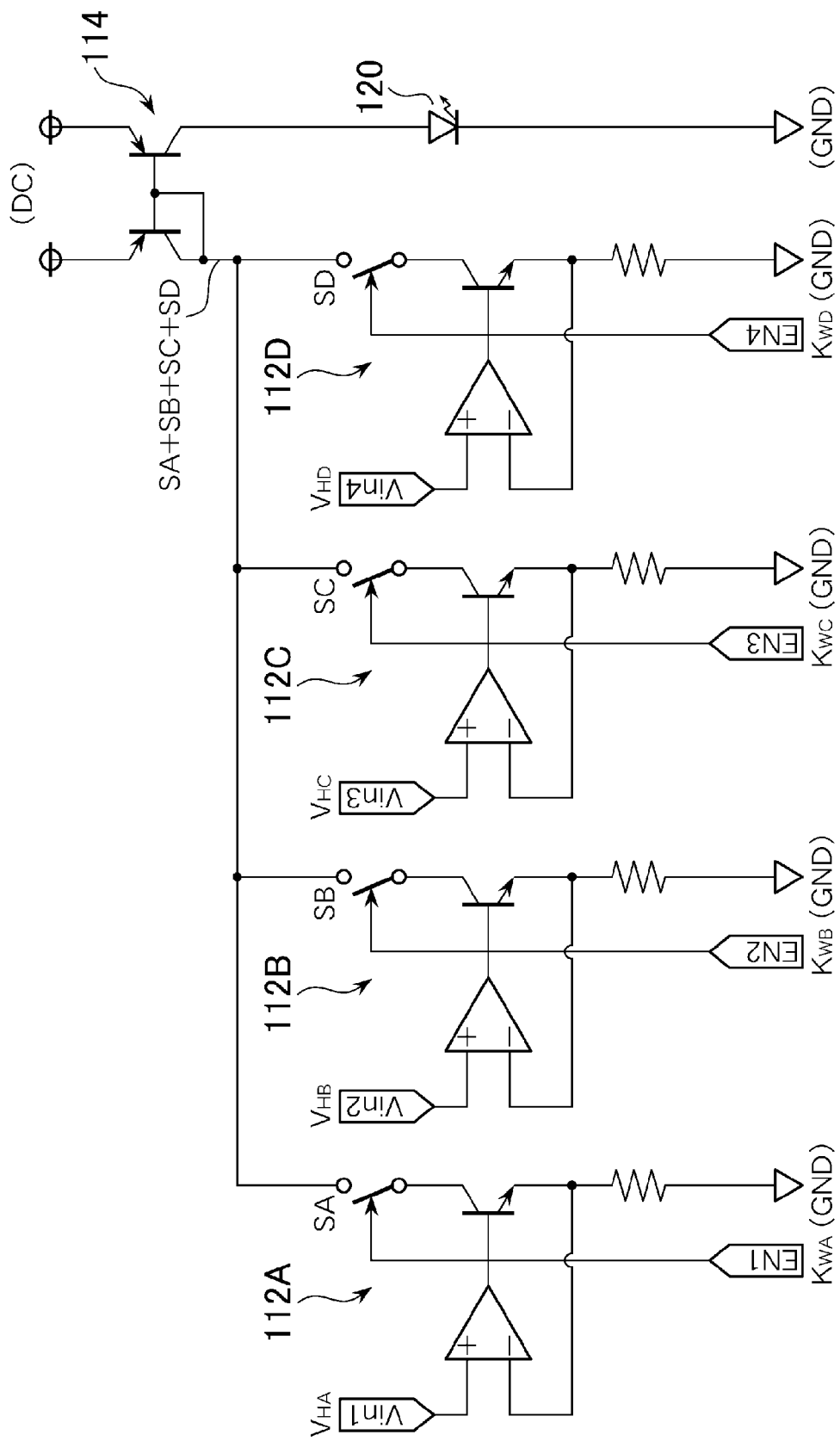
FIG. 5 is a circuit diagram showing a construction of a driving waveform generator and a multi-tone driver according to an embodiment of the present invention.

Next, constructions of the driving waveform generator 110 and the multi-tone driver 115 will be described with reference to FIG. 5. As shown in FIG. 5, the driving waveform generator 110 and the multi-tone driver 115 include tone signal generation circuits 112A through 112D, each of which includes an OPAMP, a transistor, a switch and a resistor. The tone signal generation circuits 112A through 112D generate tone signals SA through SD, respectively. Pulse amplitudes HA through HD of the tone signals SA through SD, respectively, are set by voltages VHA through VHD of non-inverting inputs Vin1 through Vin4 of the OPAMP so that the rising edge and the falling edge are set in response to control signals KWA through KWD applied to terminals EN1 through EN4 of the switch, respectively. For example, in the tone signal generating circuit 112A, the control signal KWA falls after the predetermined time period corresponding to the rising pulse width WA from the rising edge of the transmission data of FIG. 4A elapses. The switch is turned on between the rising edge and the falling edge, and the tone signal generating circuit 112A outputs the voltage VHA as the tone signal SA. The tone signal generating circuits 112B through 112D perform the same control operation and output the tone signals SB through SD, respectively. The tone signals SA through SD outputted by the tone signal generating circuits 112A through 112D are added by a wired OR circuit and supplied to the blue light-excited white LED 120 via a current mirror circuit 114.

The control signals KWA through KWD may be regarded as a 4-bit digital signal determined based on logic values of the transmission data. For example, the 4-bit digital signal (KWA, KWB, KWC and KWD) becomes (1, 1, 1, 1) at a time point (the rising edge) when a logic value of the transmission data of FIG. 4A is changed from L to H, becomes (0, 1, 1, 1) after the time period corresponding to the pulse width WA of the tone signal SA from the rising edge elapses, becomes (0, 0, 0, 1) at a time point (the falling edge) when the logic value of the transmission data is changed from H to L, and becomes (0, 0, 1, 1) after the time period corresponding to the pulse width WC of the tone signal SC after the falling edge elapses.

The above-described blue light-excited white LED 120 is embodied by disposing a YAG-based fluorescent material around a blue LED. The fluorescent material disposed around the blue LED is excited due to the blue light emitted from the blue LED, and a yellow light outputted from the fluorescent material is mixed with the blue light emitted from the blue LED to be outputted as a pseudo-white light. The blue light-excited white LED is universal and requires lower fabrication costs compared to other white LEDs such as an ultraviolet (UV)-excited white LED constituted by combining a UV LED with a fluorescent material emitting the three primary colors of red (R), green (G) and blue (B) and a three-color emission-type white LED embodied by assembling three types of LEDs, namely a red LED, a green LED and a blue LED in a single package.

Figure 2:
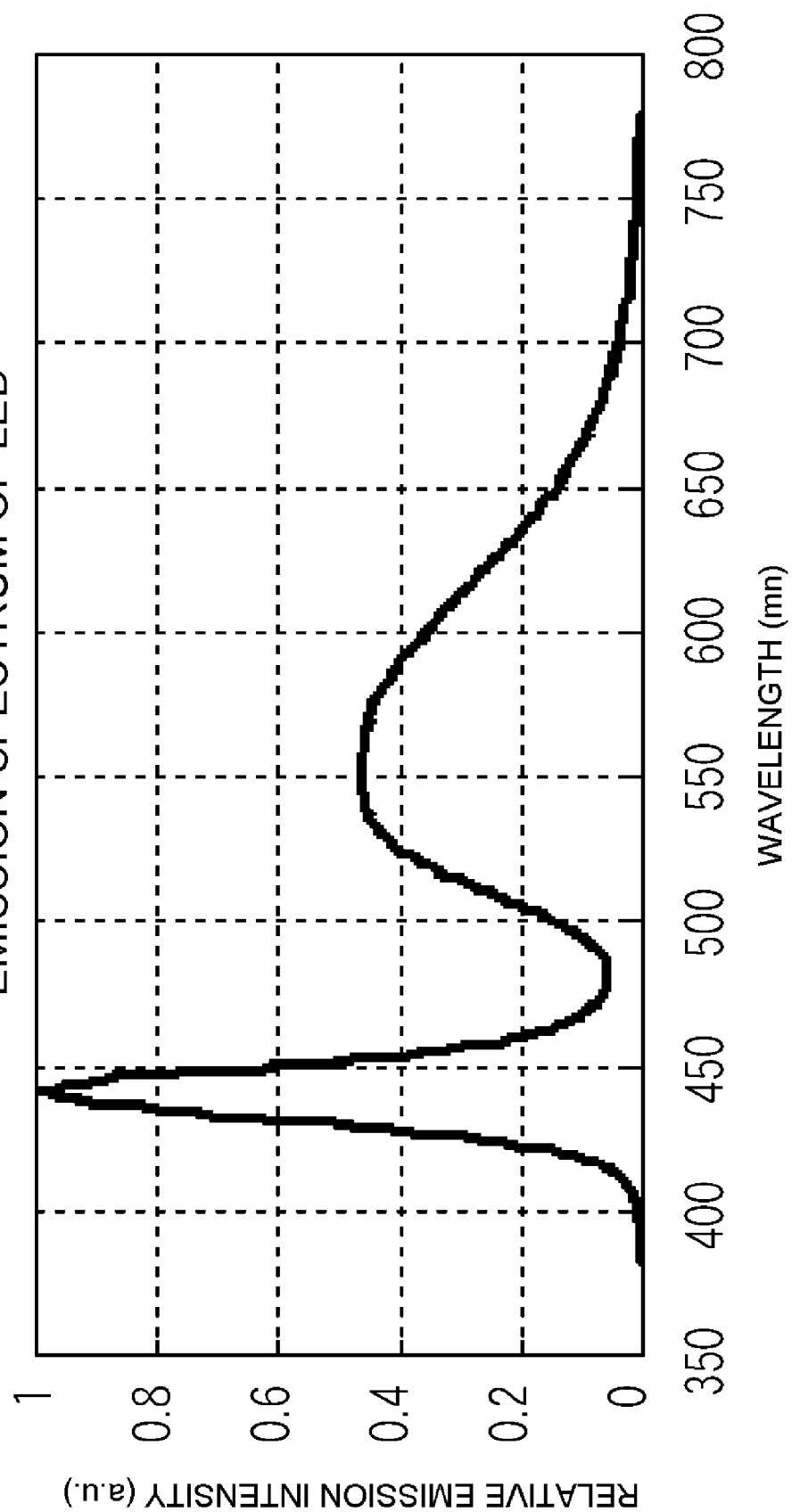
FIG. 2 is a graph depicting an emission spectrum of a blue light-excited white light emitting diode (LED) according to an embodiment of the present invention.

FIG. 2 is a graph depicting an emission spectrum of the blue light-excited white LED 120. In FIG. 2, an abscissa denotes a wavelength (nm), and an ordinate denotes relative emission intensity (a.u.). As shown in FIG. 2, the emission spectrum has a peak wavelength between about 440 to 470 nm due to the blue light emitted by the blue LED and has a lower peak wavelength near about 550 nm due to a wavelength component distributed from green to yellow by the fluorescent material.

Figure 3:
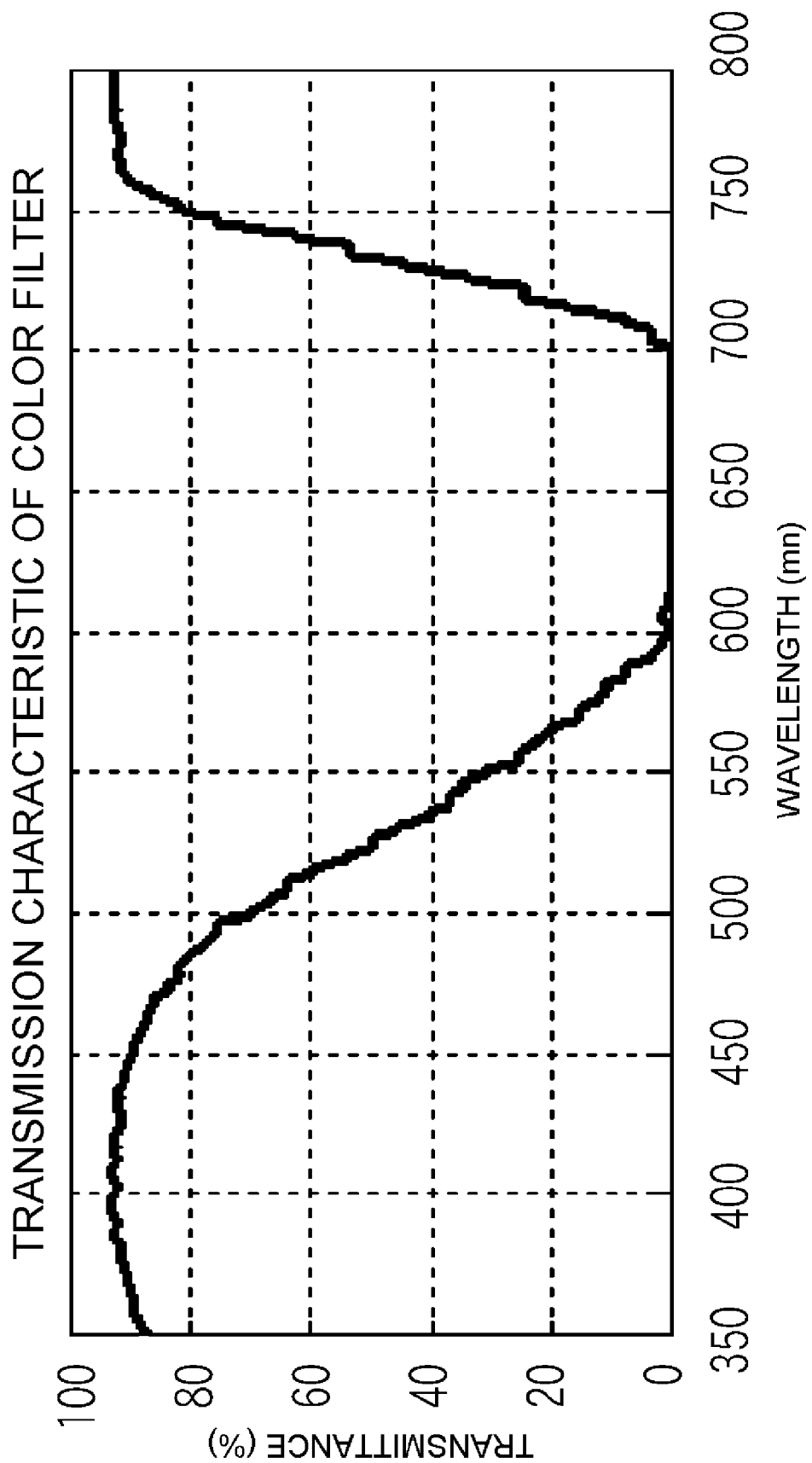
FIG. 3 is a graph depicting a transmission characteristic of a color filter according to an embodiment of the present invention.

The color filter 205 transmits a wavelength component corresponding to the blue light of the white light emitted from the blue light-excited white LED 120 and attenuates the wavelength component distributed from green to yellow. The color filter transmitting the wavelength component corresponding to the blue light is sometimes referred to as a blue color filter in view of the transmitted wavelength component. FIG. 3 is a graph depicting a transmission characteristic of the color filter 205. In FIG. 3, an abscissa denotes a wavelength (nm) and an ordinate denotes transmittance (%). As shown in FIG. 3, the color filter 205 has a low transmittance with respect to at least a wavelength component between about 500 nm and 750 nm and a high transmittance with respect to a wavelength component between about 440 nm to 470 nm. Accordingly, since the wavelength component of 550 nm, which is an emission component emitted from the fluorescent material having the low response speed of the white light emitted from the blue light-excited white LED 120, is blocked by the color filter 205, an improved transmission speed is provided compared to a case without the color filter.

Figure 6A:
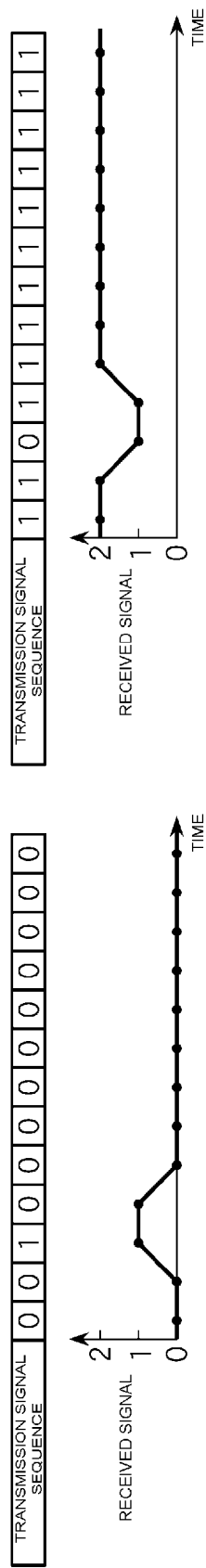
Figure 6B:
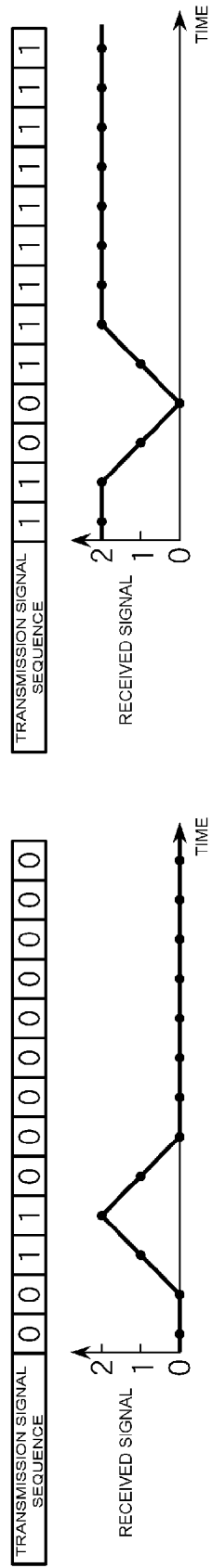

Next, the processing of the equalizer 220 will be described with reference to FIGS. 6A through 6D. The equalizer 220 equalizes an electrical signal inputted from the trans-impedance AMP 215 to a duobinary code with respect to waveform. The duobinary code is a type of partial response code which intentionally allows an inter-code interference to enable narrow low-band transmission compared to typical baseband transmission. According to an embodiment of the present invention, the equalizer 220 equalizes a transmission signal sequence from the output of an NRZI modulation circuit of the transmitter 100 to the output of the equalizer 220 of the receiver 200 so that the transmission signal sequence has a 1+D low-pass-filter (LPF) characteristic. That is, the bit at time k is added to the bit at time k−1 so that the transmission signal sequence is converted into a 3-value (0, 1 and 2) output sequence. FIGS. 6A through 6D depicts relationships between the transmission signal sequence and output sequence (received signal sequence) of the equalizer 220 for the transmission signal sequence having code lengths of 1T through 4T. Since graphs at the right half of FIGS. 6A through 6D show examples obtained by inverting bits "0" and "1" of corresponding graphs at the left half thereof, only the graphs at the left half of FIGS. 6A through 6D will be described, and a description of the graphs at the right half thereof will be omitted. T denotes a bit interval (unit interval) after encoding. When the transmission data is encoded according to a (1, x) RLL code and then NRZI-modulated, the minimum pulse width of the transmission signal sequence is 2T. FIG. 6A depicts a relationship between the transmission signal sequence having the code length of 1T and the corresponding output sequence. As shown in the graph at the left half of FIG. 6A, the transmission signal sequence (0, 0, 1, 0, 0, 0, 0, 0, . . . ) having the code length of 1T is added to a sequence obtained by delaying the transmission signal sequence by 1 bit and to obtain an output sequence (0, 0, 1, 1, 0, 0, 0, 0, . . . ). The same schemes are applied to transmission signal sequences having the code lengths of 2T through 4T to obtain output sequences. That is, an output sequence (0, 0, 1, 2, 1, 0, 0, 0, . . . ) may be obtained from the transmission signal sequence (0, 0, 1, 1, 0, 0, . . . ) having the code length of 2T shown in FIG. 6B. In addition, an output sequence (0, 0, 1, 2, 2, 1, 0, 0, . . . ) may be obtained from the transmission signal sequence (0, 0, 1, 1, 1, 0, 0, 0, . . . ) having the code length of 3T shown in FIG. 6C, and an output sequence (0, 0, 1, 2, 2, 2, 1, 0, . . . ) may be obtained from the transmission signal sequence (0, 0, 1, 1, 1, 1, 0, 0, . . . ) having the code length of 4T shown in FIG. 6D.

Figure 7:
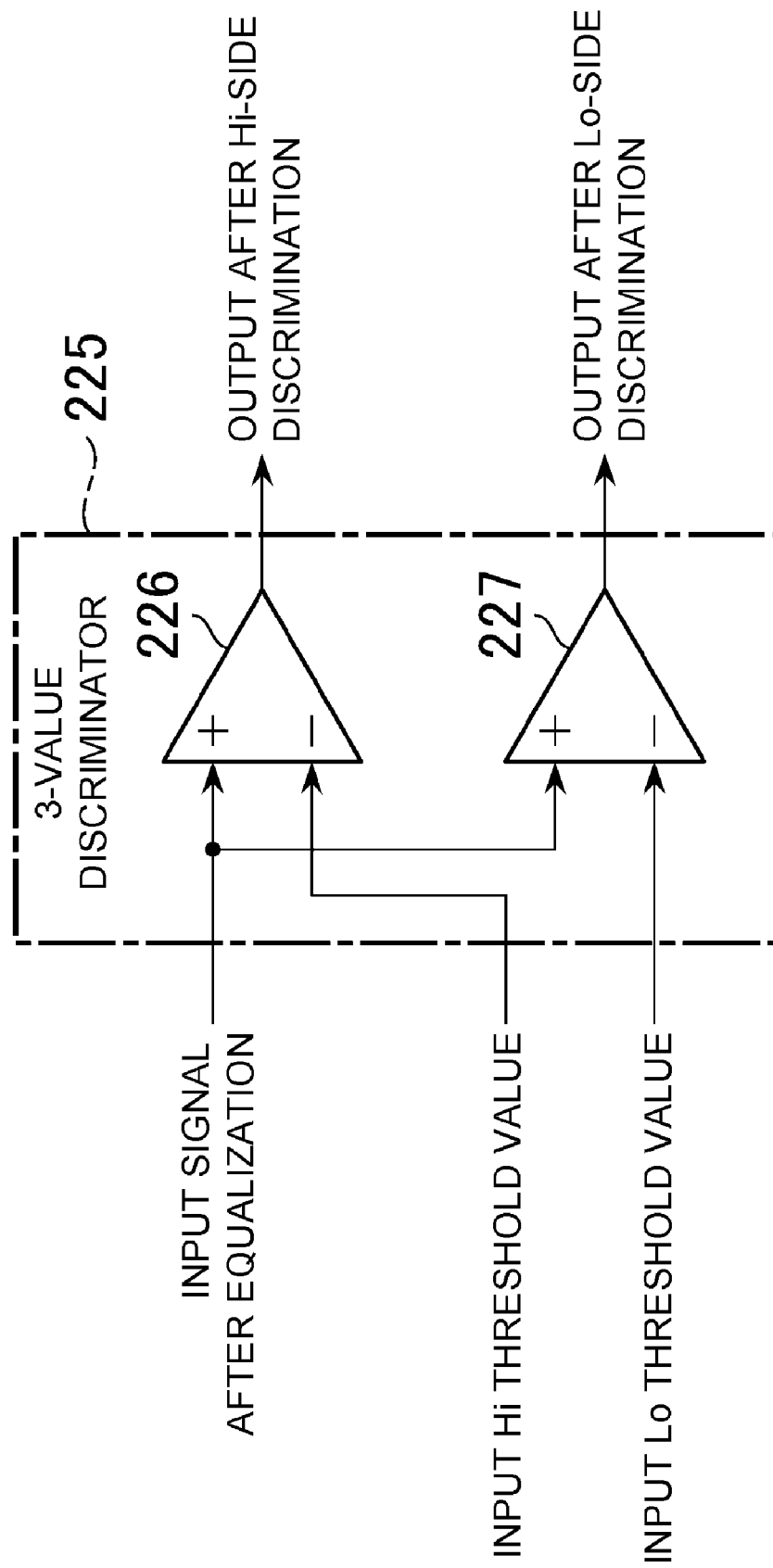
FIG. 7 is a circuit diagram showing a construction of a 3-value discriminator according to an embodiment of the present invention.

FIG. 7 is a circuit diagram showing a construction of the 3-value discriminator 225 according to an embodiment of the present invention. The 3-value discriminator 225 includes comparators 226 and 227. The comparator 226 compares a signal (duobinary signal) duobinary-encoded by the equalizer 220 to the Hi threshold value outputted from the threshold value generator 230. The comparator 227 compares the duobinary signal outputted from the equalizer 220 to the Lo threshold value outputted from the threshold value generator 230. Further, 3-value data (output level) is determined according to rules shown in Table 2 based on the comparison result of each of the comparators 226 and 227.

TABLE 2

| | Output level | | |
|---|---|---|---|
| | 0 | 1 | 2 |
| Result of comparison to the Lo threshold value | Lo | Hi | Hi |
| Result of comparison to the Hi threshold value | Lo | Lo | Hi |

That is, when both of the outputs of the comparators 226 and 227 are low (when the signal equalized by the equalizer 220 is less than both of the Hi threshold value and the Lo threshold value), the output level is determined as zero. When the output of the comparator 226 is low and the output of the comparator 227 is high (when the signal equalized by the equalizer 220 is greater than the Lo threshold value and less than the Hi threshold value), the output level is determined as one. When both of the outputs of the comparators 226 and 227 are high (when the signal equalized by the equalizer 220 is greater than both of the Hi threshold value and the Lo threshold value), the output level is determined as two. Thus, the duobinary signal outputted from the equalizer 220 is discriminated into three values (0, 1 and 2).

Figure 8:
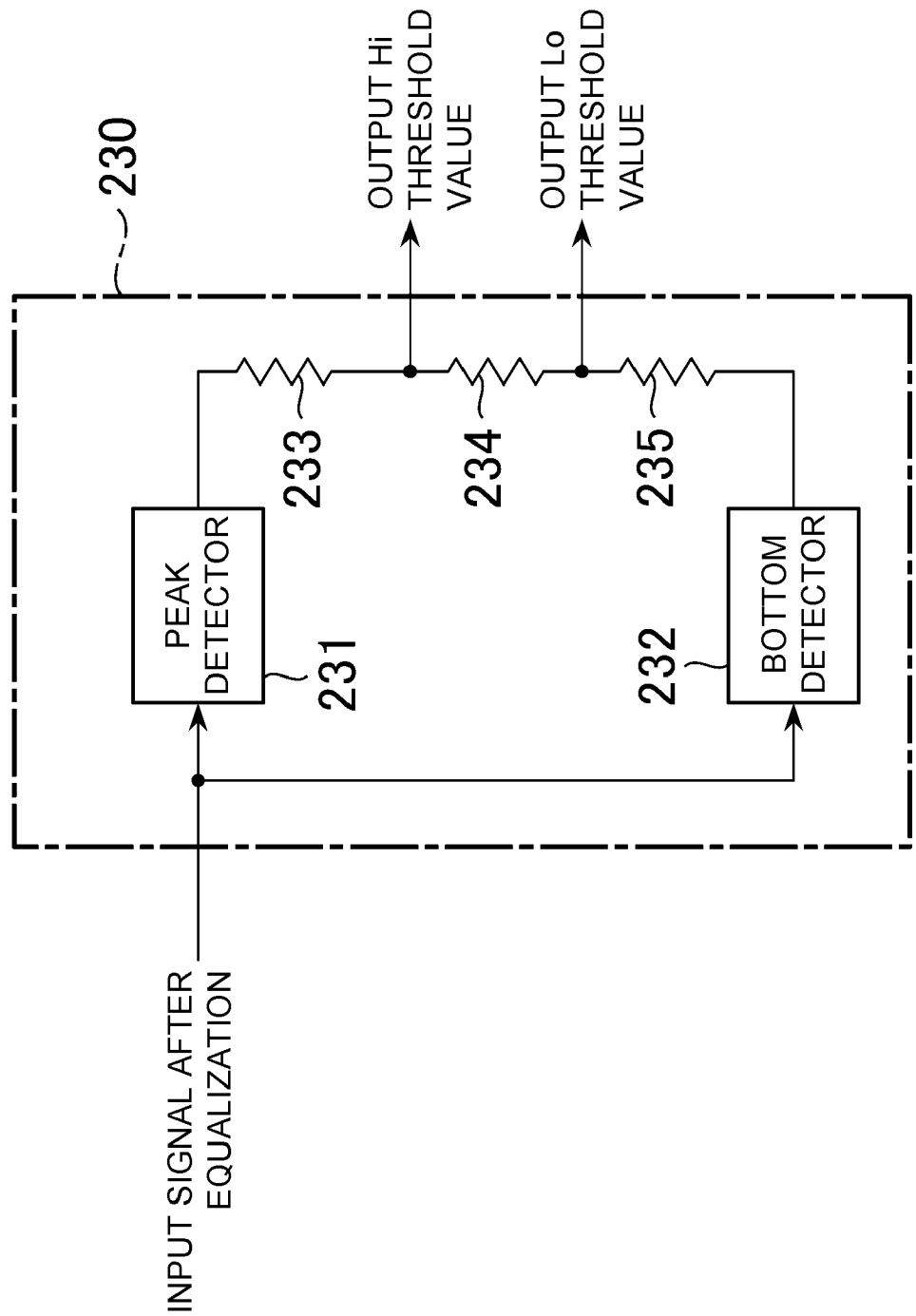
FIG. 8 is a circuit diagram showing a construction of a threshold value generator according to an embodiment of the present invention.

FIG. 8 is a circuit diagram showing a construction of the threshold value generator 230 according to an embodiment of the present invention. The threshold value generator 230 includes a peak detector 231, a bottom detector 232 and resistors 233 through 235. The duobinary signal outputted from the equalizer 220 is inputted to the peak detector 231 and the bottom detector 232. The peak detector 231 detects a peak voltage of the inputted duobinary signal, while the bottom detector 232 detects a bottom voltage of the inputted duobinary signal. The detected peak voltage and the detected bottom voltage serve as the Hi threshold value and the Lo threshold value according to resistances of the resistors 233 through 235 and the Hi threshold value and the Lo threshold value are inputted to the 3-value discriminator 225.

The PLL 240 generates a data clock signal in synchronization with the duobinary signal outputted from the equalizer 220. A timing of the discrimination at which the PLL 240 performs the discrimination deviates by half a clock signal from the case of 2-value determination. The output signal of the 3-value discriminator 225 is retimed by the data clock signal received from the PLL 240 and then outputted to the Viterbi decoder 245.

Figure 9:
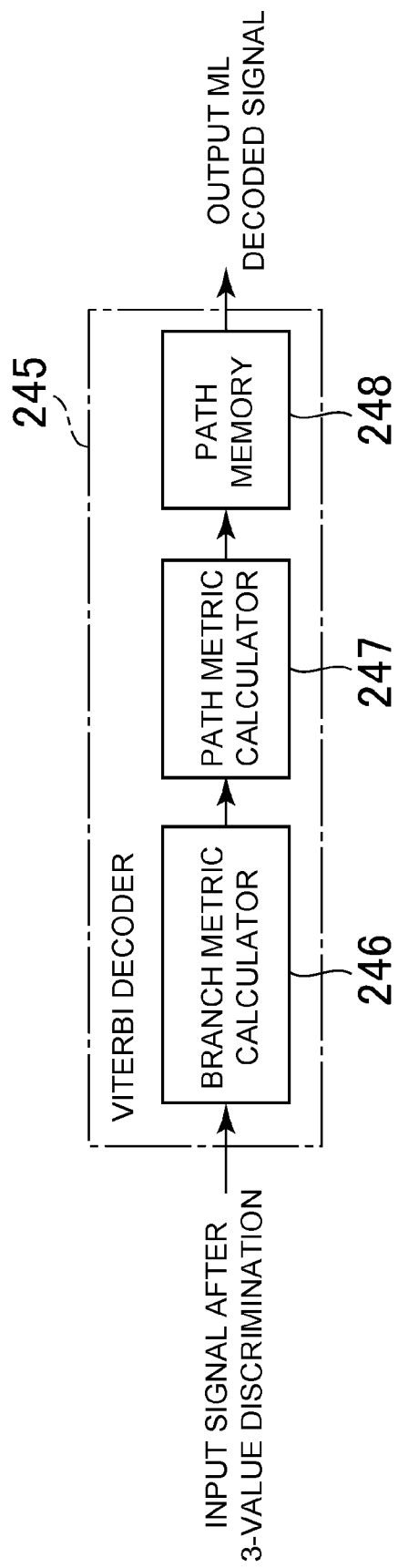
FIG. 9 is a circuit diagram showing a construction of a Viterbi decoder according to an embodiment of the present invention.
Figure 10:
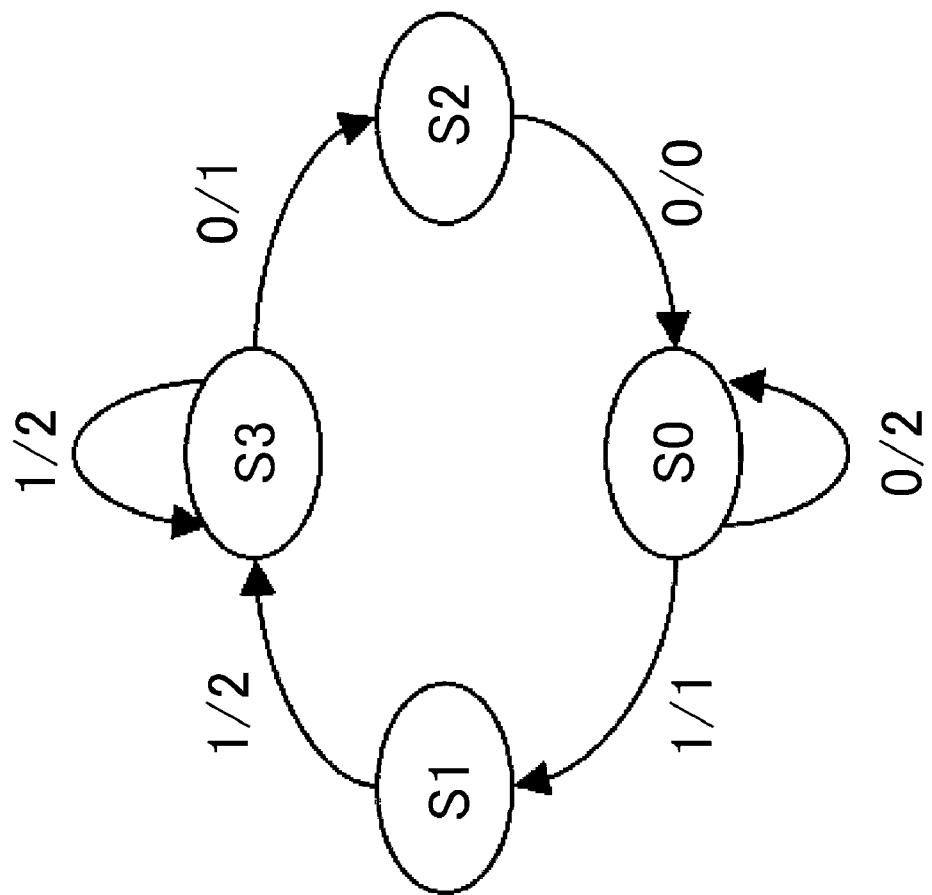
FIG. 10 is a state transition diagram of a Viterbi decoder according to an embodiment of the present invention.
Figure 11:
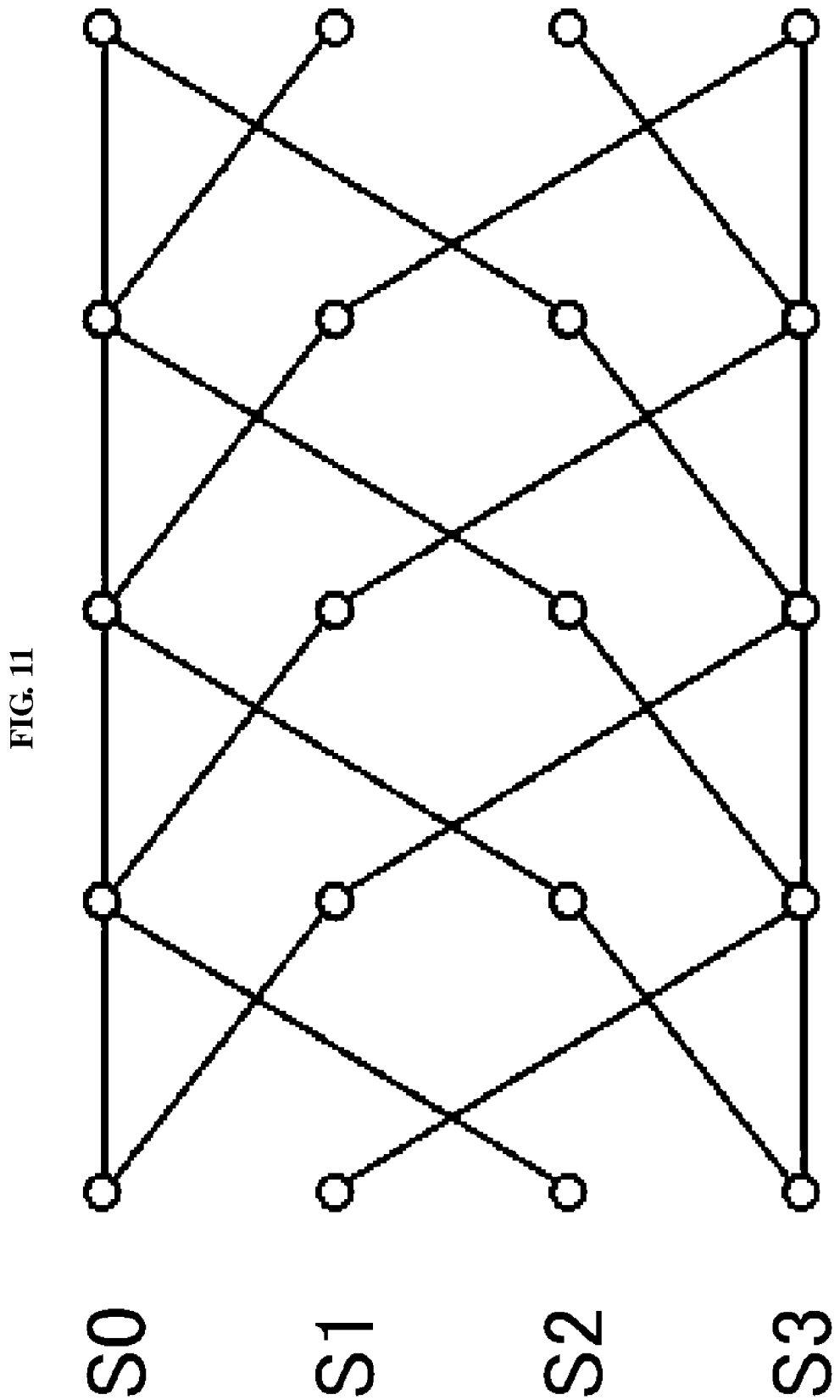
FIG. 11 is a trellis diagram of a Viterbi decoder according to an embodiment of the present invention.

FIG. 9 is a circuit diagram showing a construction of the Viterbi decoder 245 according to an embodiment of the present invention. The Viterbi decoder 245 includes a branch metric calculator 246, a path metric calculator 247 and a path memory 248. The branch metric calculator 246 computes a branch metric by calculating a Euclidean distance between a 3-value signal generated by the 3-value discriminator 225 and each of reference values (i.e., 0, 1 and 2), and outputs the computed branch metric to the path metric calculator 247. The path metric calculator 247 calculates a most likely path from all state transitions possible based on the branch metric calculated by the branch metric calculator 246, and stores the most likely path, i.e. survival path in the path memory 248. FIG. 10 depicts a state transition diagram of the Viterbi decoder 245, and FIG. 11 depicts a trellis diagram corresponding to the state transition diagram of FIG. 10. As shown in FIGS. 10 and 11, an input signal sequence from the 3-value discriminator 225 is makes transitions among four states, namely S0, S1, S2 and S3. Here, 1/2, 0/1, 0/0 and 1/1 denote relationships between inputs and outputs. The survival path stored in the path memory 248 is sequentially merged, and the merged code sequence is outputted as a result of decoding to the (1, x) RLL decoder 250. In an embodiment of the present invention, since a Euclidean distance between respective waveform patterns increases due to the equalization of the (1, x) RLL-encoded transmission data, error correction capability by Viterbi decoding is improved. In addition, since the Viterbi decoder 245 makes a hard decision, the Viterbi decoder 245 does not require a multi-bit analog-to-digital converter, thereby simplifying a circuit configuration of the receiver 200.

As described above, the Viterbi decoder 245 performs a maximum-likelihood (ML) decoding of the 3-value signal outputted from the 3-value discriminator 225 and outputs the result of the decoding to the (1, x) RLL decoder 250. The ML-decoded output signal is RLL-decoded by the (1, x) RLL decoder 250 to obtain a receiving data.

Figure 12:
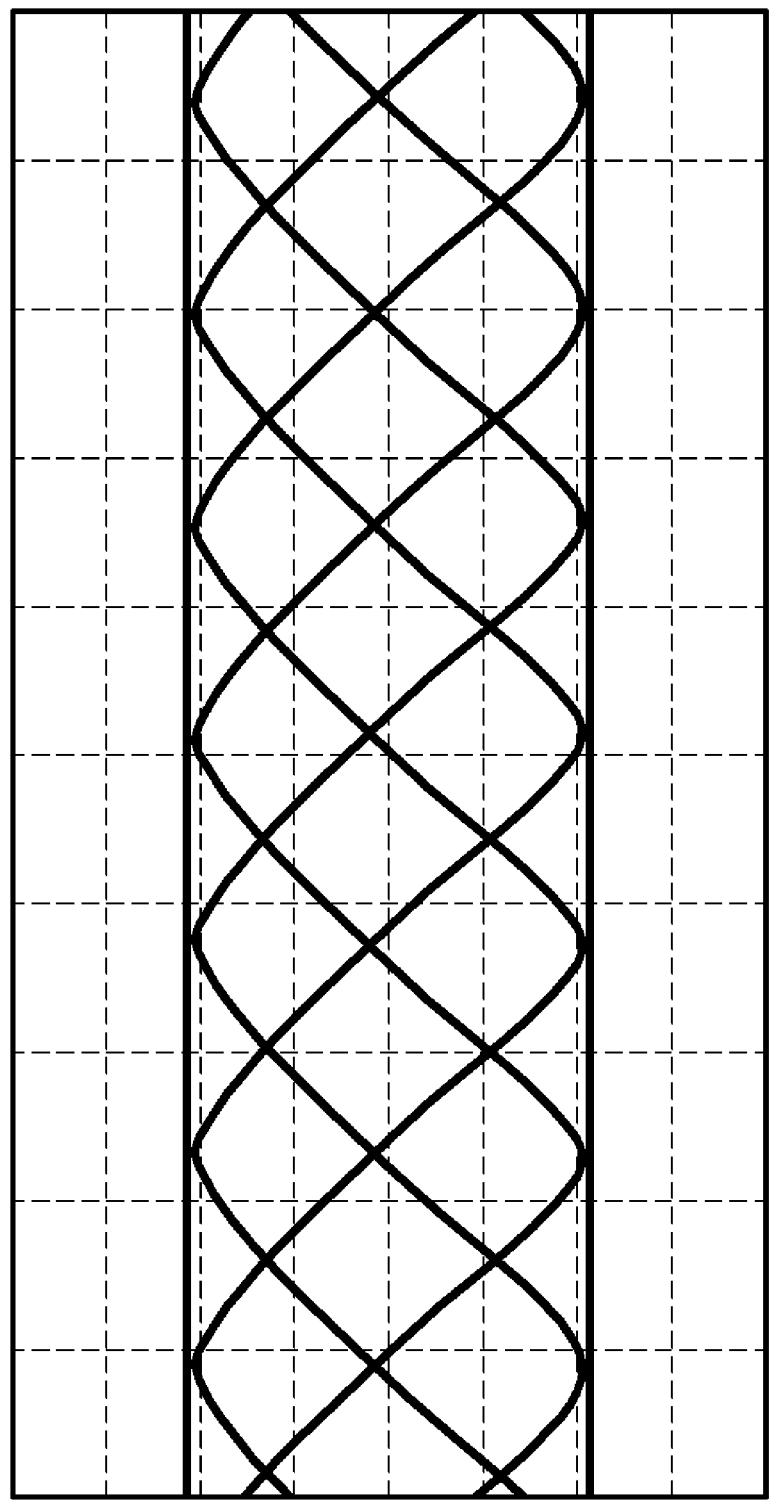
FIG. 12 is a graph depicting an eye pattern according to an embodiment of the present invention.

Next, a communication distance measured using a visible light communication system according to an embodiment of the present invention will be described with reference to FIGS. 12 through 14. Measurement results shown in FIGS. 12 through 14 were obtained under the following conditions. First, a transmission speed was adjusted to 100 Mbps before RLL encoding. In addition, a generic white LED having a rated current of about 500 mA (during a pulse drive) was used as the blue light-excited white LED 120 and driven under the following driving conditions. (1) A current HA of a rising pulse SA: 32.9 mA (2) A current HB of a data pulse SB: 49.4 mA (3) A current HC of a falling pulse SC: 59.8 mA (4) A pre-bias current HD: 5.2 mA (5) Each of a rising pulse width WA and a falling pulse width WC was adjusted to one half of the unit interval T (T/2). A Si-PIN photodiode having a light-receiving diameter of about 7 mmφ with a lens was used as the PD 210. The equalizer 220 was adjusted such that the signal equalized by the equalizer 220 has an eye pattern shown in FIG. 12. The resistances of the resistors 233, 234 and 235 of the threshold value generator 230 were adjusted to have a ratio of 27:43:30. In addition, after a frequency characteristic of the equalizer 220 and an initial threshold value are determined, adjusting or changing the frequency characteristic of the equalizer 220 and the initial threshold value are unnecessary. The Viterbi decoder 245 included a 10-stage path memory. Furthermore, a register exchange method was used.

As described above and shown in FIG. 12, according to various embodiments of the present invention, since the transmission signal corresponding to the code length of 1T does not exist due to the encoding of the transmission signal according to the (1, x) RLL code, the equalizer 220 does not output a signal corresponding to a sequence (0, 0, 1, 1, 0, 0, ...) or a sequence (2, 2, 1, 1, 2, 2, ...). That is, the transition from "1" to "1" does not occur due to the dk side in the output sequence of the equalizer 220. Accordingly, the discrimination of data and the extraction of clocks by the PLL 240 are facilitated.

Figure 13:
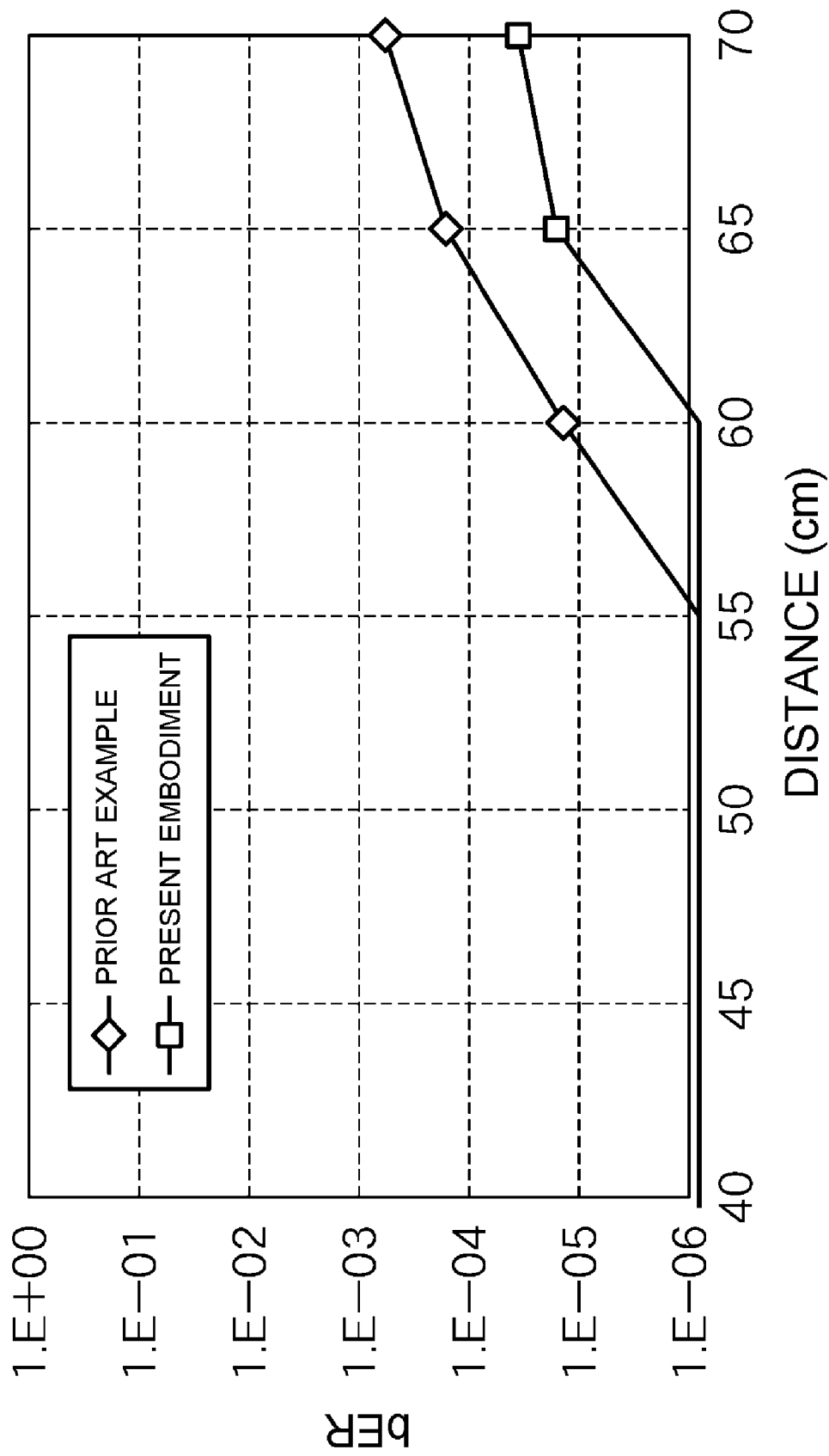
FIG. 13 is a graph showing a relationship between a communication distance and a bit error rate according to an embodiment of the present invention.
Figure 14:
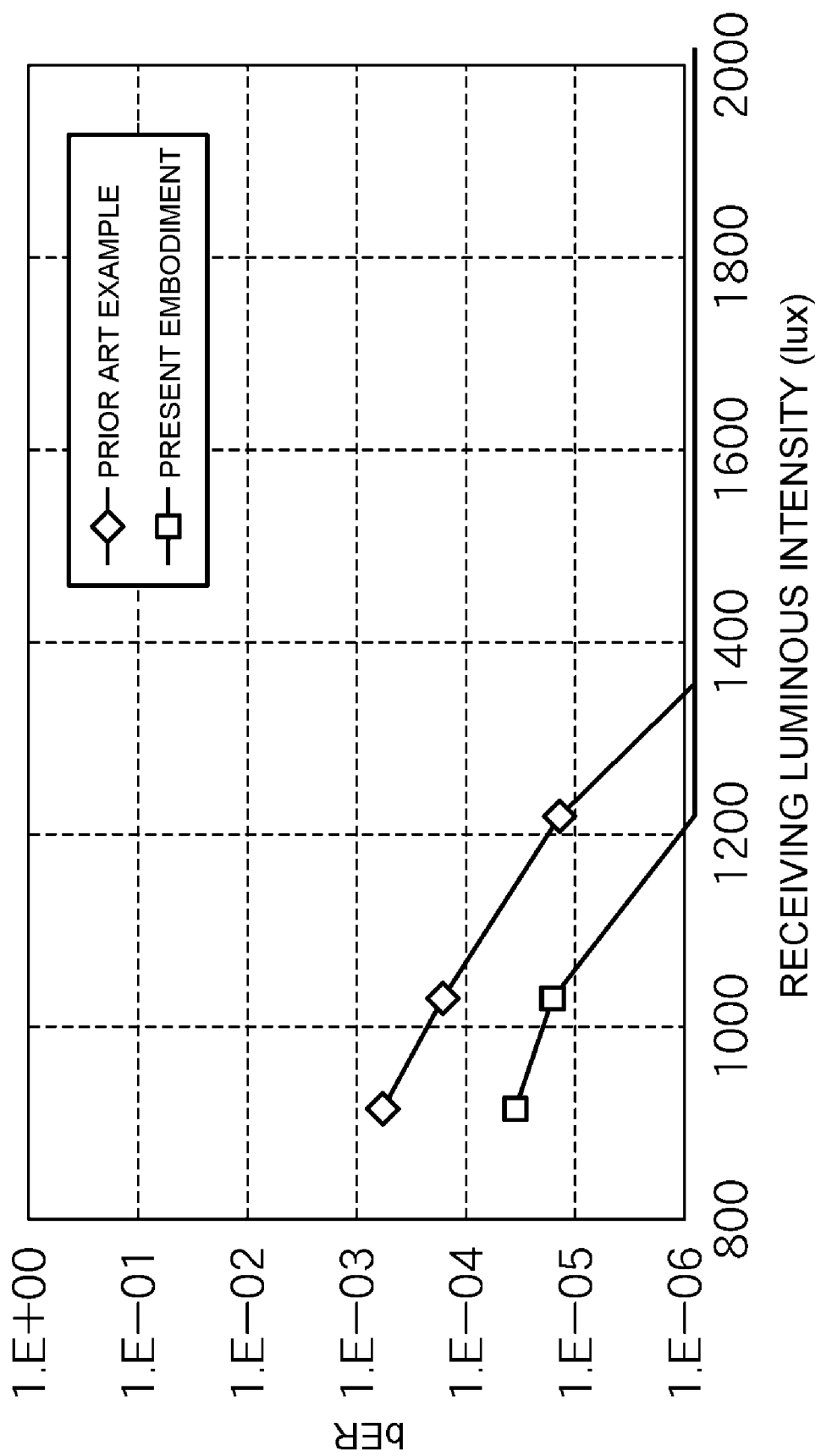
FIG. 14 is a graph showing a relationship between a receiving luminous intensity and a bit error rate according to an embodiment of the present invention.
Figure 15:
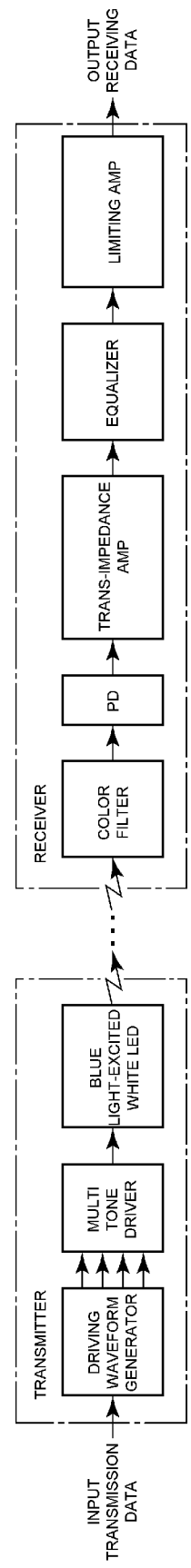
FIG. 15 is a block diagram showing a visible light communication system according to Comparative example.

FIG. 13 is a graph showing measurement results of a bit error rate with respect to a communication distance according to an embodiment of the present invention. FIG. 14 is a graph showing measurement results of a bit error rate with respect to a receiving luminous intensity of a receiving surface of a receiver according to an embodiment of the present invention. Measurement results shown as Comparative example were obtained using the communication system shown in FIG. 15. The communication system shown in FIG. 15 has the same configuration as a communication system disclosed in International Publication No. WO 2010/035896. That is, a transmitter of the communication system shown in FIG. 15 has the same configuration as the transmitter 100 shown in FIG. 1. Transmission data inputted to the transmitter shown in FIG. 15 is first encoded by the (1, x) RLL encoder (not shown). In addition, a multi-tone driving current is generated based on the RLL-encoded data, and a white LED is driven due to the driving current. Meanwhile, a receiver of the communication system shown in FIG. 15 differs from the receiver 200 according to one embodiment of the present invention in that a receiving signal is not changed into a duobinary code but changed into a 2-value signal using a limiting AMP without using Viterbi decoding.

From the measurement results shown in FIG. 13, it can be seen that the visible light communication system according to one embodiment of the present invention has a longer communication distance than that of the Comparative example shown in FIG. 15 when the bit error rates are the same. In addition, from the measurement results shown in FIG. 14, it can be seen that the visible light communication system according to one embodiment of the present invention has a lower bit error rate than that of the Comparative example shown in FIG. 15 when the receiving luminous intensity are the same.

According to various embodiments of the present invention as described above, the visible light communication receiver, the visible light communication system and the visible light communication method embodied by a simple processing circuit with increased communication distance between the transmitter and the receiver and a high transmission speed are provided. In particular, since neither the transmitter 100 nor the receiver 200 according to the embodiment of the present invention requires an ADC having a high bit resolution or an FFT (fast Fourier transform) processing circuit used when to performing a data transmission operation via a multiplexing of a sub-carrier, each of the transmitter 100 and the receiver 200 may be embodied using a simple circuit configuration.

The present invention is not limited to the above-described embodiments and various changes may be made therein without departing from the spirit and scope of the present invention. (1) An emission component emitted from a fluorescent material includes not only a yellow component complementary to a blue component but also a red component so that the color rendering of the blue light-excited white LED 120 can be improved. (2) The circuit configuration of the driving waveform generator 110 and the multi-tone driver 115 shown in FIG. 5 is only an example and may be appropriately changed. (3) A modulation code may be a DC-free (1, x) RLL code or one of various codes other than a 17PP code. For example, eight-to-twelve modulation (ETM) disclosed in Japanese Patent No. 3957679 or four-to-six modulation (FSM) disclosed in "Four-to-six modulation code for blue laser recording channels," IEEE ELECTRONICS LETTERS, VOL. 42, No. 20, 1169-1170 p. may be used. (4) A sequence of the color filter 205 and a lens constituting a condensing system in the receiver 200 may be changed. (5) The color filter 205 may be omitted. (6) The rising and falling pulse widths of the driving waveform generator are not limited to examples explicitly described herein. (7) By using an FEC (forward error correction) such as a Reed-Solomon code as an external code, an increase in communication distance may be further achieved. In addition, by combining the external code with interleaving or bit scrambling, the increase in communication distance may be further achieved. (8) The Viterbi decoder 245 may use a trace-back method instead of a register exchange method as a decoding method.

What is claimed is:

1. A visible light communication receiver comprising:
a receiving unit configured to receive a visible light signal from a blue light-excited white LED driven by a driving current signal generated by adding a rising pulse and a falling pulse to a rising edge and a falling edge of a transmission data, respectively, the transmission data being encoded according to a DC-free RLL code having a minimum run of 1 and NRZI-modulated prior to adding the rising pulse and the falling pulse;
a photoelectric converter configured to convert the visible light signal received by the receiving unit into an electrical signal;
an equalizer configured to equalize the electrical signal generated by the photoelectric converter to a duobinary signal;
a discriminator configured to compare a level of the duobinary signal to a first threshold and a second threshold higher than the first threshold to generate a 3-value signal;
a maximum-likelihood decoder configured to ML-decode the 3-value signal generated by the discriminator to output a decoded signal; and
a decoder configured to RLL decode the decoded signal outputted by the maximum-likelihood decoder.

2. The receiver according to claim 1, wherein the RLL code is a 17PP code.

3. The receiver according to claim 1, wherein the blue light-excited white LED includes: a blue LED; and a fluorescent material excited by a blue light emitted by the blue LED to emit a fluorescence having a wavelength component complementary to the blue light, and
wherein the receiving unit includes a filter configured to remove the wavelength component.

4. The receiver according to claim 3, wherein a light from the blue light-excited white LED has a peak wavelength ranging from 440 to 470 nm.

5. The receiver according to claim 1, wherein the 3-value signal comprises a first value, a second value and a third value, and
the discriminator is configured to generate the first value in response to the level of the duobinary signal being lower than the first threshold, the second value in response to the level of the duobinary signal being higher than the first threshold and lower than the second threshold, and the third value in response to the level of the duobinary signal being higher than the second threshold.

6. The receiver according to claim 1, further comprising a threshold generator configured to generate the first threshold and the second threshold according to a bottom voltage and a peak voltage of the duobinary signal, respectively.

7. A visible light communication system comprising:
a transmitter including a modulator configured to encode a transmission data according to a DC-free RLL code having a minimum run of 1 and NRZI-modulate the transmission data encoded according to the DC-free RLL code, a driving current generator configured to generate a driving current signal by adding a rising pulse and a falling pulse to a rising edge and a falling edge of the transmission data modulated by the modulator, respectively, and a blue light-excited white LED driven by the driving current signal; and
a receiver including a receiving unit configured to receive a visible light signal from the blue light-excited white LED, a photoelectric converter configured to convert the visible light signal received by the receiving unit into an electrical signal, an equalizer configured to equalize the electrical signal generated by the photoelectric converter to a duobinary signal, a discriminator configured to compare a level of the duobinary signal to a first threshold and a second threshold higher than the first threshold to generate a 3-value signal, a maximum-likelihood decoder configured to ML-decode the 3-value signal generated by the discriminator to output a decoded signal and a decoder configured to RLL decode the decoded signal outputted by the maximum-likelihood decoder.

8. A visible light communication method comprising:
(a) encoding a transmission data according to a DC-free RLL code having a minimum run of 1 and NRZI-modulating the transmission data;
(b) generating a driving current signal by adding a rising pulse and a falling pulse to a rising edge and a falling edge of the transmission data encoded and modulated in (a), respectively, and driving a blue light-excited white LED with the driving current signal;
(c) receiving a visible light signal from the blue light-excited white LED;
(d) converting the visible light signal received in (c) into an electrical signal;
(e) equalizing the electrical signal to a duobinary signal;
(f) comparing a level of the duobinary signal to a first threshold and a second threshold higher than the first threshold to generate a 3-value signal;
(g) ML-decoding the 3-value signal to output a decoded signal; and
(h) RLL-decoding the decoded signal.

* * * * *